United States Patent
Ghosh et al.

[19]

[11] Patent Number: 6,097,099
[45] Date of Patent: Aug. 1, 2000

[54] ELECTRO-THERMAL NESTED DIE-ATTACH DESIGN

[75] Inventors: Prosenjit Ghosh, Portland, Oreg.; Sunil Thomas, Richardson, Tex.

[73] Assignee: Texas Instruments Incorporated, Dallas, Tex.

[21] Appl. No.: 08/951,076

[22] Filed: Oct. 15, 1997

Related U.S. Application Data

[62] Division of application No. 08/546,054, Oct. 20, 1995, Pat. No. 5,745,985.

[51] Int. Cl.[7] ............................ H05K 3/32; H05K 13/04; H01L 23/29; H01L 23/48
[52] U.S. Cl. .................... 257/786; 257/790; 257/782; 257/783; 257/668; 29/834; 29/840; 29/841; 361/719; 361/770; 361/771; 174/260
[58] Field of Search .................... 257/666, 668, 257/676, 778–784, 734, 737, 738, 788, 789–795, 772; 29/834, 840, 841; 361/771, 770, 719

[56] References Cited

U.S. PATENT DOCUMENTS

| | | | |
|---|---|---|---|
| 3,495,322 | 2/1970 | Goldstein, M.B. | 29/473.1 |
| 4,323,914 | 4/1982 | Berndlmaier et al. | 257/778 |
| 4,436,785 | 3/1984 | Dietz et al. | 428/427 |
| 4,459,166 | 7/1984 | Dietz et al. | 156/89 |
| 4,483,067 | 11/1984 | Parmentier | 29/840 |
| 4,647,959 | 3/1987 | Smith | 257/668 |
| 4,862,249 | 8/1989 | Gorlsen | 257/668 |
| 5,136,365 | 8/1992 | Pennisi et al. | 257/783 |
| 5,233,504 | 8/1993 | Melton et al. | 361/760 |
| 5,379,191 | 1/1995 | Carey et al. | 257/778 |
| 5,448,114 | 9/1995 | Kondoh et al. | 257/778 |
| 5,448,115 | 9/1995 | Kondoh et al. | 257/778 |
| 5,483,106 | 1/1996 | Echigo et al. | 257/783 |
| 5,484,959 | 1/1996 | Burns | 257/666 |
| 5,489,752 | 2/1996 | Cognetti et al. | 174/266 |
| 5,552,437 | 9/1996 | Yamagata | 257/782 |
| 5,590,462 | 1/1997 | Hundt et al. | 29/840 |
| 5,629,546 | 5/1997 | Doi et al. | 257/788 |
| 5,633,535 | 5/1997 | Chao et al. | 257/778 |
| 5,641,995 | 6/1997 | Sloma et al. | 257/783 |
| 5,653,019 | 8/1997 | Bernhardt et al. | 257/777 |
| 5,659,952 | 8/1997 | Kovac et al. | 257/668 |
| 5,661,902 | 9/1997 | Katchmar | 29/840 |
| 5,686,162 | 11/1997 | Polak et al. | 428/76 |
| 5,729,440 | 3/1998 | Jimorez et al. | 257/738 |
| 5,864,470 | 1/1999 | Shim et al. | 361/777 |
| 5,873,161 | 2/1999 | Chen et al. | 29/830 |
| 5,925,936 | 7/1999 | Yamaji | 257/787 |

FOREIGN PATENT DOCUMENTS

WO 90/13991  11/1990  WIPO.

*Primary Examiner*—Alexander O. Williams
*Attorney, Agent, or Firm*—Ronald O. Neerings; Wade James Brady, III; Frederick J. Telecky, Jr.

[57] ABSTRACT

A design having a semiconductor microchip bonded to a circuit board is described. This design may include: a printed circuit board (58); a semiconductor microchip (56) bonded to the circuit board (58) by means of an adhesive layer placed between the bonding surface of the microchip (56) and the desired bonding site on the circuit board (58); the adhesive layer providing for thermal relief as well as electrical contact between the microchip (56) and circuit board (58), and consisting of two or more concentric regions that adjoin but do not overlap one another; one being a center core region (50) of thermally and electrically conductive material; the other being a perimeter region (54) of thermally conductive and electrically nonconductive material surrounding the center core region (50) such that the perimeter region's (54) inner boundary completely bounds the center core region (50); and such that the perimeter region's (54) outer boundary extends to a lead on the microchip (56). Other devices, systems, and methods are also disclosed.

19 Claims, 4 Drawing Sheets

50.37mm² 33.98%

32.48mm² 21.76%

45.36mm² 30.60%

33.97mm² 22.90%

39.03mm² 26.00%

8.82mm² 5.91%

11.57mm² 7.81%

3.35mm² 2.25%

9.19mm² 6.16%

17.94mm² 12.02%

1.76mm²    1.22%

3.52mm²    2.43%

10.83mm²    7.45%

0.28mm²    0.19%

0.46mm²    0.31%

9.08mm²    6.28%

0.98mm²    0.65%

4.25mm²    2.96%

ELECTRO-THERMAL NESTED DIE-ATTACH DESIGN

This is a divisional of application Ser. No. 08/546,054, filed Oct. 20, 1995 now U.S. Pat. No. 9,745,985.

FIELD OF THE INVENTION

This invention generally relate electro-thermal nested die-attach design for Tape-Automated Bonding (TAB) semiconductor microchips.

BACKGROUND OF THE INVENTION

Without limiting the scope of the invention, its background is described in connection with TAB mounted semiconductor microchips, as an example.

Semiconductors are widely used in integrated circuits for electronic applications, including high speed computers and wireless communications. Such integrated circuits typically use multiple transistors fabricated in single crystal silicon. Many integrated circuits now contain multiple levels of metallization for interconnections. A single semiconductor microchip may have thousands, and even millions of transistors. Logically, a single microchip may also have millions of lines interconnecting the transistors. In addition, modern microchips have numerous other elements that make up part of the integrated circuit. As electrical current runs through these elements at astronomical speeds, heat dissipation becomes a major concern. Therefore, thermal relief becomes a major design requirement for modern microchips. In addition to the thermal relief that modern microchips require, some of these microchips also require an electrical contact as the chip is mounted to the circuit board.

In addition, increased miniaturization in the electronics industry is causing more and more components to be placed onto circuit boards by the Tape Automated Bonding (TAB) method. Securing the leads on the device to the board can be achieved by two processes —"Formed Lead" and "No Form" process. Each has its advantages and disadvantages.

In the Formed Lead process, leads are excised and formed to a gull-wing shape. In this process, the leads are formed in such a way that the die-attach thickness is accommodated between the die and the printed wiring board. In this process, the consistency of the die-attach is very critical. Warpage of the board can cause delamination or unsatisfactory coverage.

In the No Form process, leads are excised but not formed. Leads have and act much like angular cantilever beams. However, die-attach thickness is less critical in this method since the cantilever shaped leads are bent down during the bonding process. Accordingly, die-attach thickness may vary in this process. Not surprisingly, industry is slowly switching over to the No Form lead process. One of the driving forces for the switch-over is the ease of machine vision rather than the ease of die-attach.

SUMMARY OF THE INVENTION

It has been discovered that a common problem for board components that require thermal relief as well as electrical contact, is achieving both without shorting leads. In order to achieve both, the general method has been to have a film or a paste of a homogenous thermally and electrically conductive die-attach adhesive material sandwiched between the semiconductor device and the circuit board. For applications using adhesive films, the generally accepted practice has been to cut the die-attach at some percentage smaller than the pad size. The smaller sized adhesive allows growth during processing, but is small enough to prevent shorting the leads. For applications requiring pastes, the applied area is also smaller than the actual pad size for the same reasons as above. Currently, industry has accepted the compromises and the problems associated with such a weak design and process: shorting, low yields, large voids, difficult process control, thermal and electrical in-efficiencies, etc. Moreover, industry has unsuccessfully attempted to work around and even questioned the need for the core electrical path. However, studies have repeatedly shown that the center core of these devices are required to provide a critical contact to a ground plane. Lack of a solid ground plane such as this breeds numerous problems including radio frequency and electro magnetic interferences.

In addition, as the throughput for boards with die-attached components increase, achieving a good bond between the core of the semiconductor and printed circuit board, with a high degree of reliability, has become essentially an impossibility. With increased thermal transfer loads on components, this problem has been exasperated by requiring an efficient thermal transfer. In addition, the bond joints based on traditional methods such as, one piece thermal/electrical die-attach films, dispensed thermal/electrical paste, and various other methods, have numerous problems. These problems include: low reliability, sensitive design, low yield, and large voids in the bond joint. Using the best methods and practices available today, percentage voids, as compared to the total area of coverage, are in double digits (10%, 12%, etc.) at best. In most production environments, voids between the component and the board, are typically between 20% to 60%. Furthermore, since the size of the void is inversely proportional to the thermal and electrical conductivity, minimizing voids is essential to a good design.

The design and process of the invention consistently reduces this voiding problem to single digits. For the first time it is not only conceivable, but very achievable to consistently have voids less than three (3) percent in a production environment. Another advantage of the invention is that it is a very forgiving design. It is a truly robust design from every perspective. The shorting problem, that was so prevalent with the previous designs, has been eliminated. Voids have been achieved as low as 0.19%. A major aspect of the design is the thermally conductive (electrically nonconductive) barrier around the electrically and thermally conductive core piece. Having both substrates fabricated from the same or molecularly compatible material and using the process of the invention, this new design eliminates shorting problem to leads and ensures an almost perfect electrical and thermal transfer. Additionally, the invention may be used with any semiconductor device that requires thermal and electrical conductivity through the printed circuit board, but requires electrical insulation at the leads.

A method of attaching a microchip onto a circuit board is described. The method may include: forming a center core portion of thermally conductive and electrically conductive material; forming a perimeter portion of thermally conductive and electrically nonconductive material; placing the center core portion of thermally conductive and electrically conductive material on a circuit board; placing the perimeter portion of thermally conductive and electrically nonconductive material around the center core portion on the circuit board; and attaching microchip component to the core portion and the perimeter portion. The method may also include applying a catalyst on the circuit board before the center core and perimeter portions. The method may also include curing the center core portion and the perimeter portion at 90 degrees C for 10 minutes and then applying a catalyst on the center core portion and the perimeter portion. The device may then be cured at 90 degrees C for 10 minutes. Other devices, systems and methods are also disclosed.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Die-attach materials are made from thermoplastic as well as thermoset material. Because of difficulties in using thermoset materials in die-attach applications and the relative ease of use of thermoplastic materials, they have gained increased popularity.

The die-attach materials used in the preferred embodiment fall in the general category of Thermoplastic Adhesives. These products typically are available in paste or film. For the preferred embodiment, film was used. Normally, the film is applied followed by pressure and a curing cycle.

The new die-attach design is comprised of two chemically compatible pieces, a center core and a perimeter. The center core is highly thermally and electrically conductive. In addition, the center core portion (in the preferred embodiment, the core portion was about 25% smaller than the die size, although this percentage may vary). The specific material used in the preferred embodiment is STAYSTICK 591 made by Alpha Metals Inc. Other materials that may be used in the STAYSTICK 500 family, include 501, 581, & 571. However, other materials with similar properties may be used.

The specific material used for the perimeter is a thermally conductive material like the center core, but is electrically insulating (in the preferred embodiment, the perimeter portion covered about 123% of die size, although this percentage vary). This eliminates shorting of the leads to the electrical and thermal core of the TAB device and acts as a physical barrier for the center core. The specific material used in the preferred embodiment was STAYSTICK 692. Other materials from this family include STAYSTICK 611, 672, & 682. However, like the center core material, other materials with similar properties may also be used.

Figure 1:
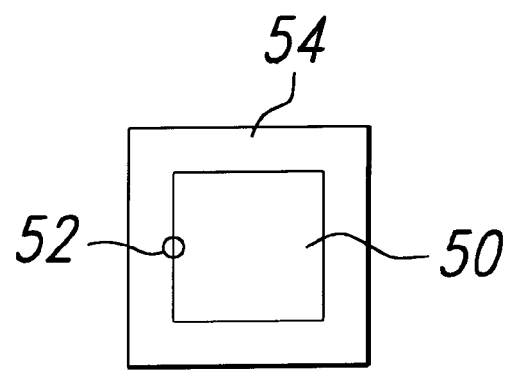
FIG. 1 is a top view of the center core and perimeter bond portions.

Now referring to FIG. 1, the center core piece of die-attach material 50 is shown with the perimeter piece of die attach material 54. The two bond pieces should join after cure produce one seamless pad to attach the microchip onto the circuit board. Therefore, the bond joint 52 should be almost indistinguishable.

Figure 2:
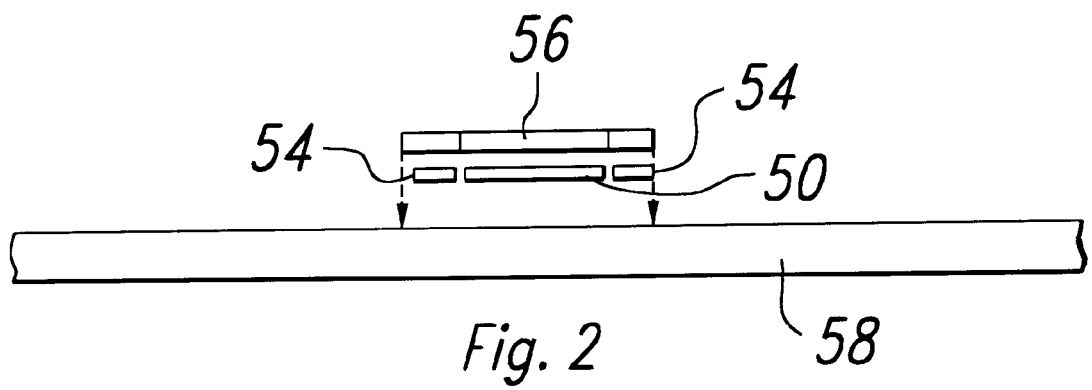
FIG. 2 is a cross view of the center core and perimeter bond portions, as well as the microchip, and the circuit board.
Figure 3A:
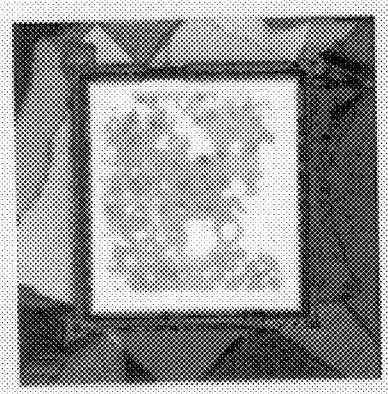
FIG. 3 is a Scanning Acoustic Microscope (SAM) photograph of five microchips produced under the old method.
Figure 3B:
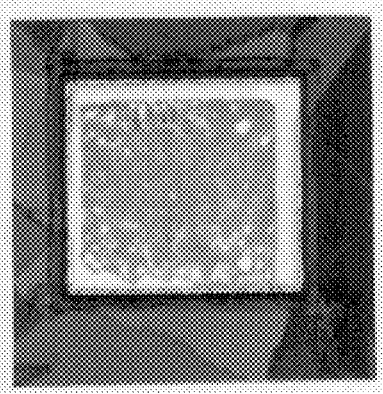
Figure 3C:
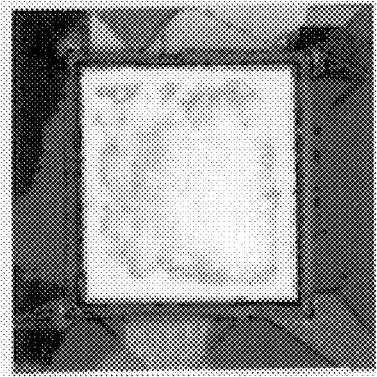
Figure 3D:
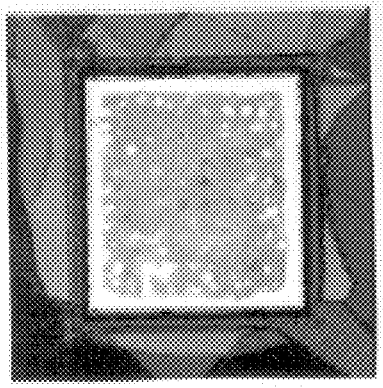
Figure 3E:
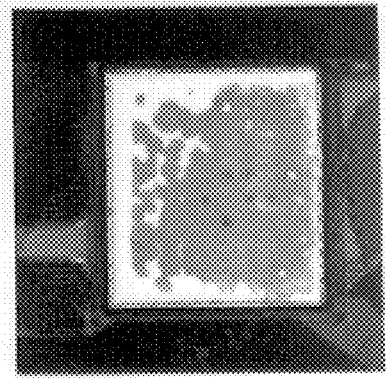
Figure 4A:
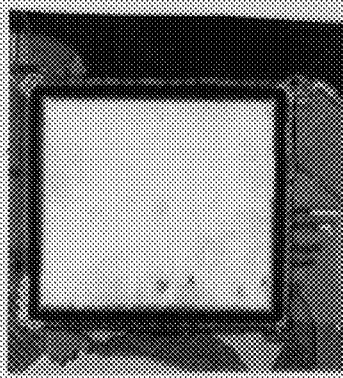
FIG. 4 is a SAM photograph of five non-functional microchips produced under the invention.
Figure 4B:
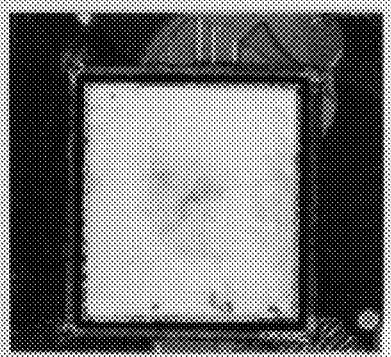
Figure 4C:
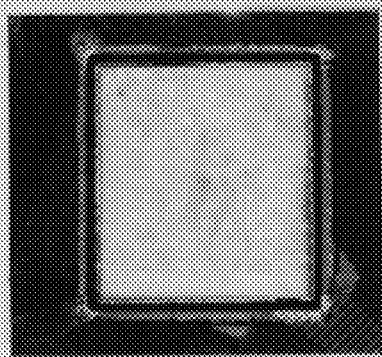
Figure 4D:
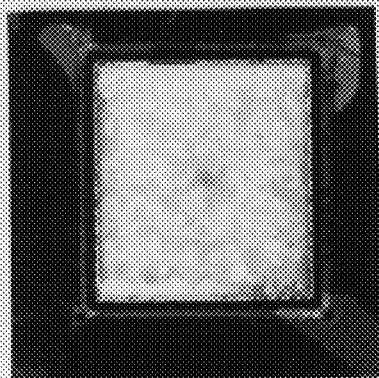
Figure 4E:
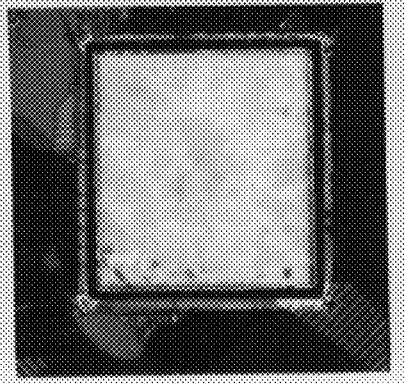
Figure 5A:
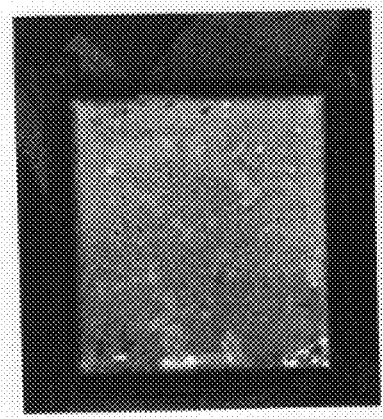
FIG. 5 is a SAM photograph of eight functional microchips produced under the invention.
Figure 5B:
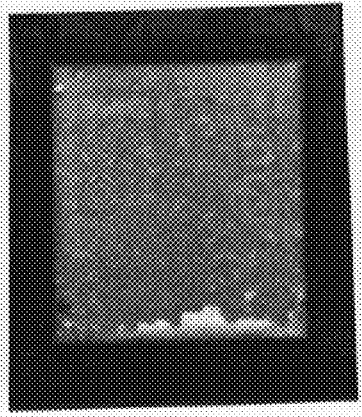
Figure 5C:
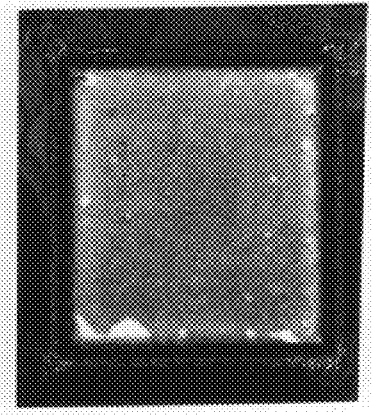
Figure 5D:
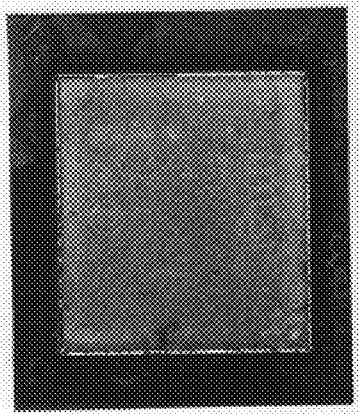
Figure 5E:
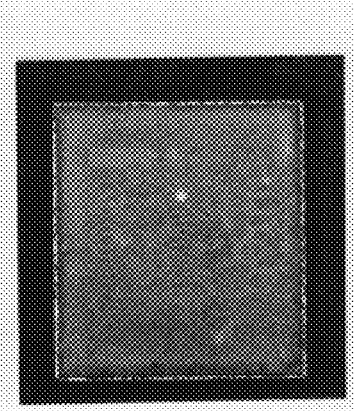
Figure 5F:
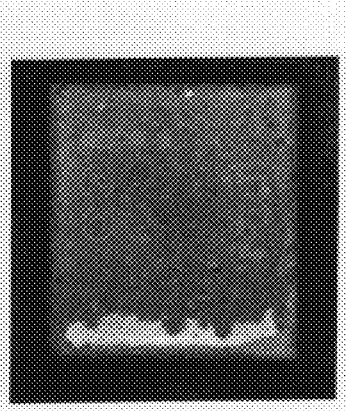
Figure 5G:
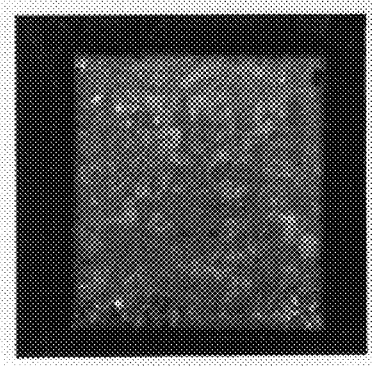
Figure 5H:
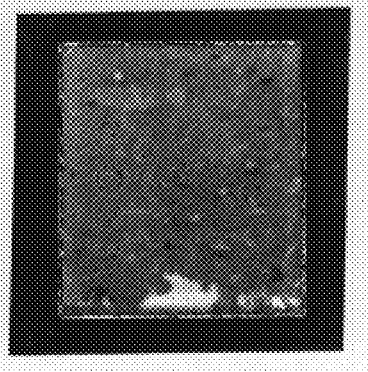

FIG. 2 depicts the bond materials 50, 54 between the microchip 56 and the printed circuit board 58.

FIG. 3 includes five SAM photographs that depict a core bond portion in the center, shown in the darker regions making up the rest of the rectangular. These SAM photographs were taken of an Intel Pentium microprocessor attached to a printed circuit board. Note that the lighter regions within the core portion of the bond material denote voids. The corresponding percentage voids are listed under the SAM photographs of each of the five examples (3a–e). These five examples were processed normally with only a core portion of bond material cut about 25% smaller than the microchip bond site in order to avoid shorting (since the behavior of the material causes it to enlarge about 13% after processing).

FIG. 4 includes five SAM photographs similar to that of FIG. 3, however these photographs were taken of printed circuit boards with Pentium processors attached by the method and materials of the preferred embodiment Note that the darker regions, in this figure, within the bond material denote voids and are almost non-existent. Not surprisingly, the corresponding percentage of voids listed under each example confirm this. In addition, the seams between the center core bond material and perimeter bond material can not be visually detected. Furthermore, since the perimeter portion of the bond material is electrically non-conductive, it may get closer to the leads of the microchip and thus evades any voids around the leads. Moreover, these first five examples were processed on non-functional printed circuit boards.

FIG. 5 includes eight SAM photographs similar to that of FIG. 4, but using fully functional printed circuit boards and live microchips. Note the small percentage voids are shown as lighter portions within the center core portion and are almost non-existent. These small amounts of voids confirm the method and materials used in the preferred embodiment.

In addition, as stated previously, the preferred embodiment is described in relation to bonding an Intel Pentium microprocessor to a printed circuit board. The steps used to attach the microchip to the board start with cutting a ring of thermally conductive and electrically non-conductive material to make the perimeter portion of the bond material. Then the electrically conductive and thermally conductive core material is cut out. A spray solvent was then sprayed on the printed circuit board (the solvent used in the preferred embodiment was di-propolyne glycol methyl ether acetate made by Alpha Metals). The center core portion is then placed in the center of the microchip bond site using an automated machine or a template. Precise placement of this piece relative to the bond site is very critical since a misplacement might cause a short with the leads. The perimeter portion, which is not electrically conductive is then placed around the core portion. The perimeter portion should be placed in a manner to ensure no overlap with the center core portion, and form a composite bond after full cure (after full cure, bond joint should be indistinguishable). The center core and perimeter portions are then cured in an oven at 90 degrees C for 10 minutes. Solvent is then sprayed on both portions. The microchip is then placed on the circuit board. The die-attach material is cured for a second time, in an oven at 90 degrees C for 10 minutes.

A few preferred embodiments have been described in detail hereinabove. It is to be understood that the scope of the invention also comprehends embodiments different from those described, yet within the scope of the claims. For example, a thermoplastic, as well thermoset material may be used as die-attach adhesive. In addition, other adhesives that are similar in characteristics to those listed may also be substituted in the invention. Moreover, the perimeter bond material may be placed onto the bond site as one unit or divided into pieces. Additionally, the invention may be used with any semiconductor device that requires thermal and electrical conductivity through the printed circuit board, but requires electrical insulation at the leads. Furthermore, words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus, comprising:
   a circuit board;
   a semiconductor microchip having a core; and
   die-attach material attaching the microchip to the circuit board, the die-attach material contacting a desired bonding surface of the core of the microchip and a desired bonding site on the circuit board, the die-attach material including a center core portion of thermally conductive and electrically conductive material and a perimeter portion of thermally conductive and electrically nonconductive material abutting the center portion.

2. The apparatus of claim 1, wherein said center core portion and said perimeter portion essentially of thermoset adhesive material.

3. The apparatus of claim 1, wherein said center core portion and said perimeter portion consist essentially of thermoplastic adhesive material.

4. The apparatus of claim 1, in which said die-attach material provides for thermal relief as well as electrical contact between the microchip and circuit board.

5. The apparatus of claim 1, in which said center core portion provides electrical contact between the core of the microchip and circuit board, and said perimeter portion provides electrical insulation between the periphery of the microchip and said center core portion.

6. The apparatus of claim 1, in which said center core portion is of a size substantially greater than half of but slightly less than the microchip's full size, and having similar aspect ratio thereto.

7. The apparatus of claim 1, in which said die-attach material is disposed in a bond layer along a single axis.

8. The apparatus of claim 1, in which said perimeter portion's inner boundary completely bounds the center core portion such that the portions adjoin but do not overlap one another, and the perimeter portion's outer boundary extends to at least a periphery of the microchip.

9. An apparatus, comprising:
   a printed circuit board;
   a semiconductor microchip having a core; and
   die-attach material attaching the microchip to the printed circuit board, the die-attach material contacting a desired bonding surface of the core of the microchip and a desired bonding site on the circuit board, the die-attach material providing for thermal relief as well as electrical contact between the microchip and circuit board and comprising a plurality of concentric regions that adjoin but do not overlap one another, the plurality having a center core region of thermally conductive and electrically conductive material, the center core region being a size substantially greater than half but slightly less than the microchip's full size, and having similar aspect ratio thereto, the plurality also having a perimeter region of thermally conductive and electrically nonconductive material abutting the center core region, and such that the perimeter region's outer boundary extends at least to the periphery of the microchip.

10. The apparatus of claim 9, in which said center core portion provides electrical contact between the core of the microchip and the circuit board, and said perimeter portion provides electrical insulation between a periphery of the microchip and said center core portion.

11. The apparatus of claim 9, in which said die-attach material is disposed along a single axis.

12. A circuit board, comprising:
   a semiconductor microchip bonded to said circuit board by die-attach material contacting a desired bonding surface of a core of the microchip and a desired bonding site on the circuit board, the die-attach material providing for thermal relief as well as electrical contact between the microchip and circuit board and comprising a plurality of concentric regions that adjoin but do not overlap one another, the plurality having a center core region of thermally conductive and electrically conductive material, the enter core region being of size substantially greater than half of but slightly less than the microchip's full size, and having similar aspect ratio thereto, the plurality also having a perimeter region of thermally conductive and electrically nonconductive material abutting the center core region such that the perimeter region's inner boundary completely bounds the center core region, and such that the perimeter region's outer boundary extends at least to the periphery of the microchip.

13. The circuit board of claim 12, in which said center core portion provides electrical contact between the core of the microchip and circuit board, and said perimeter portion provides electrical insulation between a periphery of the microchip and said center core portion.

14. The circuit board of claim 12, in which said die-attach material is disposed along a single axis.

15. The apparatus of claim 9, in which said center core portion and said perimeter portion consist essentially of thermoset adhesive material.

16. The apparatus of claim 9, in which said center core portion and said perimeter portion consist essentially of thermoplastic adhesive material.

17. The apparatus of claim 9, in which said layer provides for thermal relief as well as electrical contact between the microchip and circuit board.

18. The circuit board of claim 12, in which said center core portion and said perimeter portion consist essentially of thermoset adhesive material.

19. The circuit board of claim 12, in which said center core portion and said perimeter portion consist essentially of thermoplastic adhesive material.

* * * * *